United States Patent
Yamamoto

(10) Patent No.: US 8,766,301 B2
(45) Date of Patent: Jul. 1, 2014

(54) LIGHT EXTRACTING MEMBER

(75) Inventor: Kyoko Yamamoto, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 43 days.

(21) Appl. No.: 13/378,285

(22) PCT Filed: Jun. 15, 2010

(86) PCT No.: PCT/JP2010/060415
§ 371 (c)(1),
(2), (4) Date: Dec. 14, 2011

(87) PCT Pub. No.: WO2010/147230
PCT Pub. Date: Dec. 23, 2010

(65) Prior Publication Data
US 2012/0091447 A1  Apr. 19, 2012

(30) Foreign Application Priority Data
Jun. 16, 2009  (JP) ................................. 2009-142999

(51) Int. Cl.
*H01L 33/00* (2010.01)
*H01L 21/00* (2006.01)
*F21V 7/04* (2006.01)

(52) U.S. Cl.
USPC ................................. 257/98; 438/32; 362/612

(58) Field of Classification Search
USPC ........................ 257/40, 79–104; 438/22–47; 362/611–629
See application file for complete search history.

(56) References Cited

U.S. PATENT DOCUMENTS

| | | | | |
|---|---|---|---|---|
| 5,592,332 A * | 1/1997 | Nishio et al. | ................... | 359/619 |
| 6,617,784 B1 * | 9/2003 | Abe et al. | ..................... | 313/506 |
| 7,237,930 B2 * | 7/2007 | Onishi et al. | .................. | 362/333 |
| 2003/0184993 A1 * | 10/2003 | Yamada | ........................ | 362/31 |
| 2004/0046242 A1 * | 3/2004 | Asakawa | ...................... | 257/678 |
| 2004/0135847 A1 * | 7/2004 | Miura | ............................ | 347/48 |
| 2004/0246877 A1 * | 12/2004 | Ishizaki et al. | ........... | 369/112.23 |
| 2005/0231085 A1 * | 10/2005 | Song et al. | ................... | 313/110 |
| 2006/0221634 A1 | 10/2006 | Sato et al. | | |

(Continued)

FOREIGN PATENT DOCUMENTS

| | | |
|---|---|---|
| EP | 1443563 A2 | 4/2004 |
| JP | 2003-100444 A | 4/2003 |

(Continued)

OTHER PUBLICATIONS

Japanese Patent Office, "Notice of Rejection," issued in connection with Japanese Patent Application No. 2009-142999, dated Dec. 6, 2011.

(Continued)

*Primary Examiner* — Karen Kusumakar
(74) *Attorney, Agent, or Firm* — Sughrue Mion, PLLC

(57) ABSTRACT

A light extracting member for an organic electroluminescent element, to be provided on a side for extracting light emitted by the organic electroluminescent element, wherein a light extracting surface of the member has a concave-convex structure which is configured such that when comparing an intensity of light that enters the member and is output from the light extracting surface with an intensity of light that is output from a flat light extracting surface of a virtual member, a frontal intensity and an integrated intensity of the former are each greater by a factor of 1.3 or more.

6 Claims, 6 Drawing Sheets

(56) References Cited

U.S. PATENT DOCUMENTS

| | | | |
|---|---|---|---|
| 2007/0230158 A1* | 10/2007 | Kitayama et al. | 362/84 |
| 2009/0153972 A1 | 6/2009 | Nakamura et al. | |
| 2009/0225538 A1* | 9/2009 | Horikoshi et al. | 362/225 |

FOREIGN PATENT DOCUMENTS

| | | |
|---|---|---|
| JP | 2007-005277 A | 1/2007 |
| JP | 2007-180001 A | 7/2007 |
| JP | 2008-303363 A | 12/2008 |
| JP | 2010-123322 A | 6/2010 |
| WO | 2009-017035 A1 | 5/2009 |

OTHER PUBLICATIONS

European Search Report and Written Opinion dated Sep. 30, 2013, Issued in European Patent Application No. 10789601.1.

* cited by examiner (1)

(2)

(1)

(2)

LIGHT EXTRACTING MEMBER

CROSS REFERENCE TO RELATED APPLICATIONS

This application is a National Stage of International Application No. PCT/JP2010/060415 filed Jun. 15, 2010, claiming priority based on Japanese Patent Application No. 2009-142999 filed Jun. 16, 2009 the contents of all of which are incorporated herein by reference in their entirety.

TECHNICAL FIELD

The present invention relates to a light extracting member for an organic electroluminescent element (hereinafter may also be referred to as an organic EL element) which is to be provided on a side for extracting light emitted from the organic electroluminescent element, and also relates to a light-emitting device and an illuminating device using the light extracting member.

BACKGROUND ART

An organic EL element is a light-emitting element using an organic substance as a light-emitting material, and is composed of a pair of electrodes (an anode and a cathode) and a light-emitting layer provided between the electrodes. When voltage is applied to the organic EL element, holes are injected from the anode and electrons are injected from the cathode, and then the holes and the electrons are recombined in the light-emitting layer to emit light.

The light generated in the organic EL element is output through the electrodes, and the light is used as a light source for display devices and illuminating devices. However, not all the light generated in the element is output, and a large part of the light is trapped in the element due to reflection and the like and thus is not effectively used.

In order to achieve a certain brightness that is required for a light source, there has been proposed a light-emitting device having an increased brightness in a normal direction in which a prism sheet having a structure for suppressing reflection and the like is arranged on a light extracting side of an organic EL element to increase the rate of the light output in the normal direction (for example, see JP 2007-5277 A).

DISCLOSURE OF THE INVENTION

The organic EL element is used as a light source for a certain device, and is required to have various characteristics depending on a device in which the element is to be installed. Thus, the conventional organic EL element described above having an increased brightness in a normal direction is useful for particular devices that need the brightness in the normal direction but is not always useful for other types of devices.

It is an object of the present invention to provide a light extracting member that achieves an organic EL element usable for devices requiring other characteristics in addition to the brightness in a normal direction, and a light-emitting device and an illuminating device using the light extracting member.

The present invention relates to the light extracting member, the light-emitting device, and the illuminating device described below.

[1] A light extracting member for an organic electroluminescent element, to be provided on a side for extracting light emitted by the organic electroluminescent element, wherein a light extracting surface of the member has a concave-convex structure which is configured such that when comparing an intensity of light that enters the member and is output from the light extracting surface with an intensity of light that is output from a flat light extracting surface of a virtual member, a frontal intensity and an integrated intensity of the former are each greater by a factor of 1.3 or more.

More specifically, the member of [1] is a light extracting member for an organic electroluminescent element, to be provided on a side for extracting light emitted by the organic electroluminescent element, wherein a light extracting surface of the member has a concave-convex structure, and the concave-convex structure is configured such that a frontal intensity and an integrated intensity of light output from the light extracting surface of the member, when light emitted by the organic electroluminescent element enters a light entering surface of the member, are each greater by a factor of 1.3 or more than a frontal intensity and an integrated intensity of light output from a light extracting surface of a virtual member, the light extracting surface of which being flat, when light emitted by the organic electroluminescent element entering a light enters surface of the virtual member.

[2] The member according to [1], wherein, when applying light to the member from a planar light source arranged in parallel with the member, the member satisfies the following Equation (1):

$$I(35°)/I(70°) > 5$$

where the intensity of light output from the light extracting surface in a direction having an angle $\theta°$ with a normal direction of the light extracting surface is $I(\theta°)$, and the member has a haze value of 60% or more and a total light transmittance of 60% or more.

More specifically, the member of [2] is the light extracting member according to [1], wherein the light extracting member satisfies the following conditions of (A), (B), and (C), when applying light to the member from a planar light source arranged in parallel with the light entering surface of the member:

(A) Equation (1):

$$I(35°)/I(70°) > 5$$

is satisfied wherein an intensity of light output from the light extracting surface in a direction having an angle $\theta°$ with a normal direction of the light extracting surface of the member is $I(\theta°)$;

(B) the member having a haze value of 60% or more; and (C) the member having a total light transmittance of 60% or more.

[3] The light extracting member according to [1] or [2], wherein the light extracting member further satisfies the following Equation (2):

$$I(0)/I(35) > 1.5.$$

[4] The light extracting member according to [1] or [2], wherein the concave-convex structure is formed with a plurality of granular objects dispersed on the surface.

[5] The light extracting member according to any one of [1] to [4], wherein the light extracting member comprises a supporting substrate, an adhesion layer, and a film having the light extracting surface stacked in this order, and an absolute value of a difference between a maximum value and a minimum value among a refractive index of the film, a refractive index ns of the supporting substrate, and a refractive index na of the adhesion layer is less than 0.2.

The supporting substrate is usually a supporting substrate of the organic electroluminescent element.

[6] A light-emitting device comprising an organic electroluminescent element using the light extracting member of any one of [1] to [5].

The light extracting member is usually provided on a side for extracting light emitted by the organic electroluminescent element.

[7] An illuminating device comprising the light-emitting device of [6].

The present invention also relates to a use of the light extracting member of any one of [1] to [4] as a light extracting member for an organic electroluminescent element.

The present invention further relates to a method for using the light extracting member of any one of [1] to [4] as a light extracting member for an organic electroluminescent element, the method comprising:

providing the light extracting member on a light extracting side of the organic electroluminescent element.

Figure 1:
FIG. 1 is schematic views of a light extracting member 1.
Figure 1:
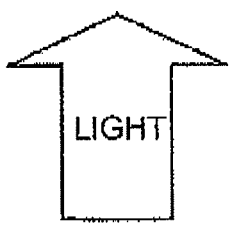
Figure 1:
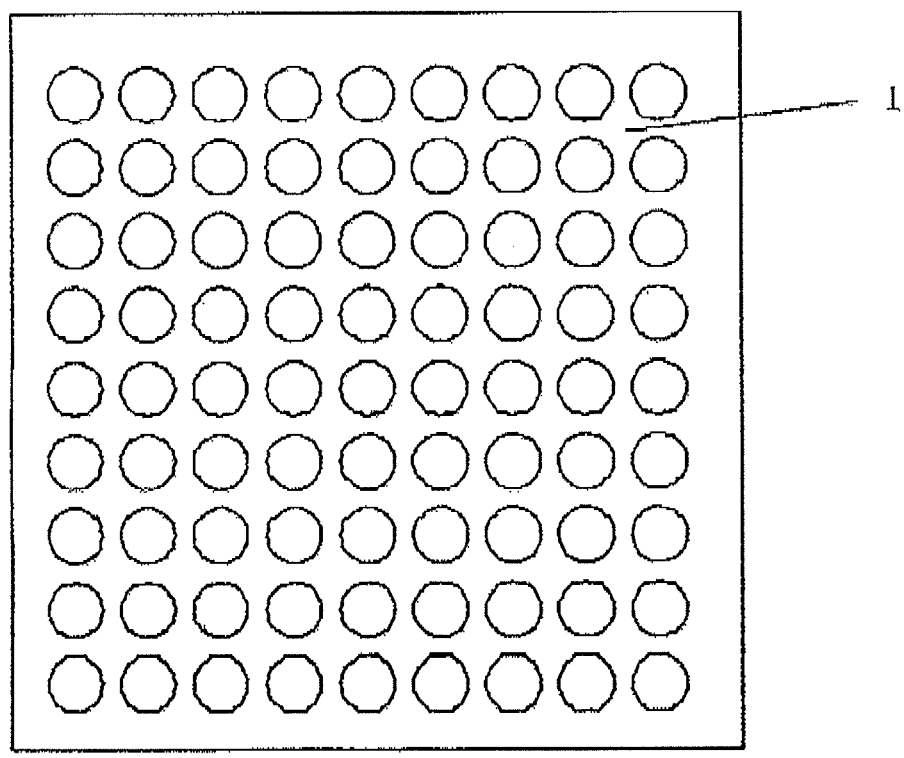

EXPLANATION OF LETTERS OR NUMERALS 1 light extracting member
2 light extracting surface
11 virtual member
21 planar light source
31 light extracting member having a stacked structure
32 supporting substrate
33 adhesion layer
34 film
35 light extracting surface
41 light-emitting device
42 organic EL element
43, 44 a pair of electrodes
45 light-emitting layer
51 organic EL element
52 light-emitting device
53 supporting substrate

EMBODIMENTS FOR CARRYING OUT THE INVENTION

1) Light Extracting Member

FIG. 1 is schematic views of a light extracting member 1 in accordance with an embodiment of the present invention. FIG. 1(1) is a side view and FIG. 1(2) is a plan view. The light extracting member 1 is a light extracting member that is used for an organic EL element and that is to be provided on a side for extracting light emitted by the organic EL element.

In an organic EL element or a light-emitting device in which the organic EL element is installed, the light extracting member 1 is provided outermost. The light extracting member 1 is provided on a side for extracting light emitted by the organic EL element, and thus light emitted from the organic EL element is output through the light extracting member 1 to the outside of the light-emitting device. The light-emitting device may be further integrated into another device or casing.

The organic EL element is classified broadly into a so-called bottom emission type element and a top emission type element depending on the direction of light emission. The bottom emission type organic EL element emits light toward a supporting substrate on which the element is installed. Hence, in the organic EL element or a light-emitting device in which the element is installed, the light extracting member 1 may be provided, for example, as the supporting substrate. The top emission type organic EL element emits light toward the side opposite to the supporting substrate. Hence, in a light-emitting device, the light extracting member 1 may be provided, for example, as a sealing member for air-tightly sealing the organic EL element.

A light extracting surface 2 of the light extracting member 1 has a concave-convex structure. The light extracting surface 2 corresponds to one surface other than the surface of the organic EL element side (light entering surface) among a pair of opposing surfaces of the light extracting member 1. Therefore, in a light-emitting device, the light extracting surface 2 is an interface with the atmosphere.

The concave-convex structure of the light extracting surface 2 is configured such that when comparing an intensity of light that enters the light extracting member 1 and is output from the light extracting surface with an intensity of light that is output from a flat light extracting surface 2 of a virtual member, a frontal intensity and an integrated intensity of the former are each greater by a factor of 1.3 or more.

Figure 2:
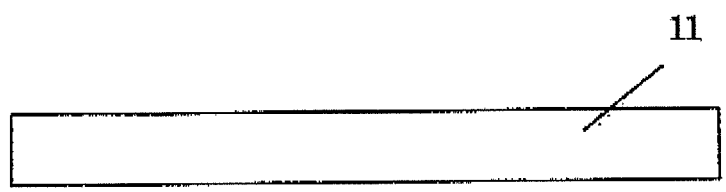
FIG. 2 is schematic views of a virtual member 11 for comparison with the light extracting member 1.
Figure 2:
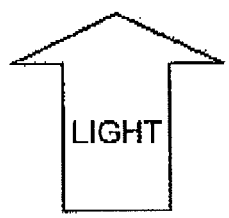
Figure 2:
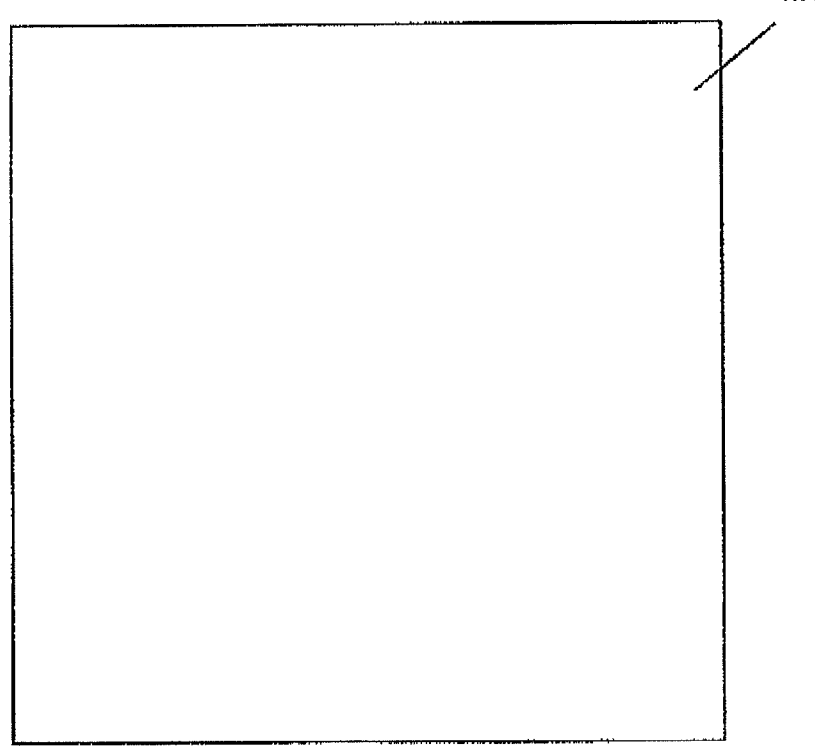

FIG. 2 schematically shows a virtual member 11 for comparison with the light extracting member 1 of the present invention. FIG. 2(1) is a side view, and FIG. 2(2) is a plan view. As shown in FIG. 2, a pair of opposing surfaces of the virtual member 11 are both flat. That is, the virtual member 11 has no concave-convex structure. The virtual member 11 has the same structure with the light extracting member 1 except for the surface shape.

When the same light enters the light extracting member 1 having a concave-convex structure and the virtual member 11 without a concave-convex structure, a frontal intensity of light output from the light extracting member 1 having a concave-convex structure is greater than a frontal intensity of light output from the virtual member 11 without a concave-convex structure by a factor of 1.3 or more. When the same light enters the light extracting member 1 having a concave-convex structure and the virtual member 11 without a concave-convex structure, an integrated intensity of light output from the light extracting member 1 having a concave-convex structure is greater than an integrated intensity of light output from the virtual member 11 without a concave-convex structure by a factor of 1.3 or more. The frontal intensity and the integrated intensity of the present member do not have the upper limits as long as each is greater by a factor of 1.3 or more. However, it may be unsuitable that only frontal intensity becomes too large. Thus, the factor of the frontal intensity is, for example, 5 or less, and the factor of the integrated intensity is, for example, 5 or less.

The frontal intensity of output light represents an intensity of light in the thickness direction of the light extracting member 1. While the light extracting surface 2 has a concave-convex structure, when the concave-convex structure is macroscopically averaged to assume a flat surface, the normal direction of the flat surface is the same as the thickness direction of the light extracting member 1. Therefore, the frontal intensity of the output light represents an intensity of light in the normal direction of the light extracting surface of the light extracting member 1.

Meanwhile, the integrated intensity of the output light is an integrated value of an intensity of light output toward not only the normal direction but also all directions with respect to the light extracting surface 2, for light output toward an opposite side to the side on which a light source of the incident light is arranged.

The organic EL element is used as a light source for various devices, and is required to have various characteristics depending on a device in which the organic EL element is installed. Some devices require a high brightness in the normal direction as described in Background Art, while some devices require an uniform emission of light in all directions. That is, it may be unsuitable for some devices that only brightness in the normal direction is too high. For example, light sources requiring uniform light emission, such as general illumination, require a light extracting member having high diffusivity. To address this, in conventional studies, improvement in the frontal intensity has been pursued even with the light intensity in directions except for the normal direction (so-called oblique directions) lowered, or uniform light emission in all directions has been pursued even with the frontal intensity lowered. In such a situation, the present inventors have found that a device formed by applying the light extracting member 1, which is configured such that the both of frontal intensity and integrated intensity increase by a factor of 1.3 or more, to the organic electroluminescent element is useful for a light-emitting device. For example, when the organic EL element is used as a light source of an illuminating device, a preferred illuminating device emits light having a high frontal intensity and can entirely illuminate a room and the like. Such an illuminating device can be realized by applying the light extracting member 1, which is configured such that the both of frontal intensity and integrated intensity increase by a factor of 1.3 or more, to the organic EL element. This uses the feature that the element itself is used as a planar (two-dimensional) light source, which is specific to the organic EL element.

For example, an inorganic LED, fluorescent lamp, or the like is a spot (zero-dimensional) or linear (one-dimensional) light source, and thus, when using them as an illuminating device, the diffusivity is more important than the frontal intensity. Therefore, the application of a light extracting member has been studied so as to increase the integrated intensity. However, the organic EL element itself can make a planar (two-dimensional) light source, and hence the application of the light extracting member 1 achieving both a high frontal intensity and a high integrated intensity can improve the performance for an illuminating device.

When applying light to the light extracting member from a planar light source arranged in parallel, the light extracting member 1 preferably satisfies Equation (1) below where an intensity of light output from the light extracting surface in a direction having an angle θ° with the normal direction is I (θ°), and preferably has a haze value of 60% or more and a total light transmittance of 60% or more. Hereinafter, the ratio of I (θ°) may also be referred to as a diffusion parameter.

$$I(35)/I(70)>5 \qquad \text{Equation (1)}$$

A haze value of less than 60% may not achieve sufficient light scattering effect, and a total light transmittance of smaller than 60% may not extract sufficient light. Thus, the employment of such a light extracting member 1 to a light-emitting device in which an organic EL element is installed may not achieve sufficient light extraction efficiency. However, the employment of the light extracting member 1 having a haze value of 60% or more and a total light transmittance of 60% or more can realize a light-emitting device having high light extraction efficiency.

The haze value is represented by the following equation. The haze value can be determined in accordance with the method described in JIS K 7136 "Determination of Haze for Plastics-Transparent Materials".

Haze value=(diffuse transmittance(%)/total light transmittance(%))×100(%)

The total light transmittance can be determined in accordance with the method described in JIS K 7361-1 "Measuring Method of Total Light transmittance for Plastics-Transparent Materials".

Figure 3:
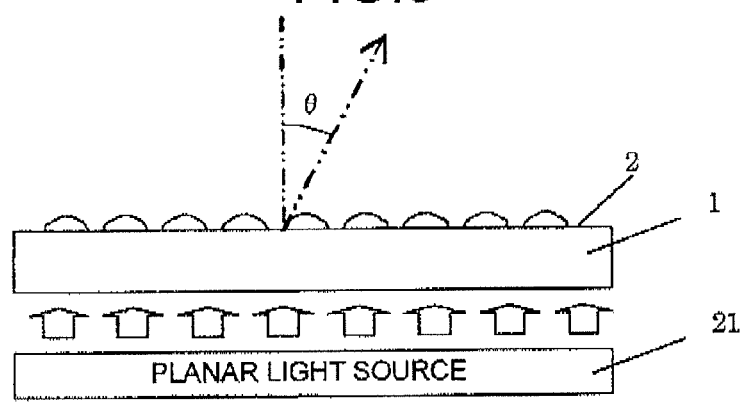
FIG. 3 is a view for explaining I (θ°).

FIG. 3 is a view for explaining I (θ°). The intensity of light output in a normal direction is defined as I (0). A planar light source 21 is arranged in parallel with the light extracting member 1 so that the light extracting surface 2 will be parallel to the light-emitting surface thereof. As described above, the organic EL element itself is a planar light source, and thus the planar light source 21 simulates the organic EL element. The method for measuring I (θ) will be described in Examples.

I (35) represents the intensity of light in a direction tilted at 35° from the normal direction, and I (70) represents the intensity of light in a direction tilted at 70° from the normal direction. A light extracting member having a higher I (35)/I (70) value outputs light toward a frontal direction in a larger amount, and hence a light extracting member 1 having an I (35)/I (70) value of higher than 5 can be suitably used for, for example, an illuminating device. Too high I (35)/I (70) value leads to a situation that only light intensity in the frontal direction becomes too high, and thus the I (35)/I (70) value is preferably 30 or less in order to illuminate a wide area.

The light extracting member 1 preferably further satisfies Equation (2) below.

$$I(0)/I(35)>1.5 \qquad \text{Equation (2)}$$

A light extracting member having a higher I (0)/I (35) value outputs light toward a frontal direction in a larger amount, and hence a light extracting member 1 having an I (0)/I (35) value of higher than 1.5 can be suitably used for, for example, an illuminating device.

Too high I (0)/I (35) value leads to a situation that only light intensity in a frontal direction becomes too high, and thus the I (0)/I (35) value is preferably 10 or less in order to illuminate a wide area.

Figure 7:
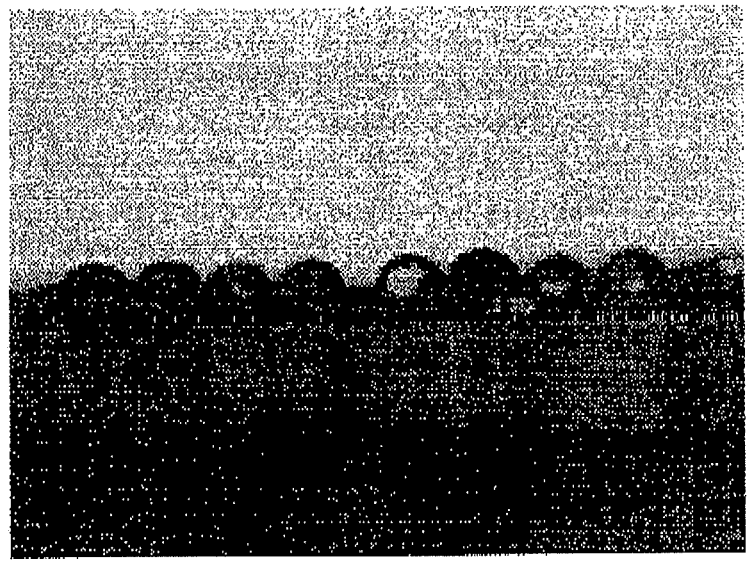
FIG. 7 is a view showing a micrograph of a cross section of UTE 12.
Figure 8:
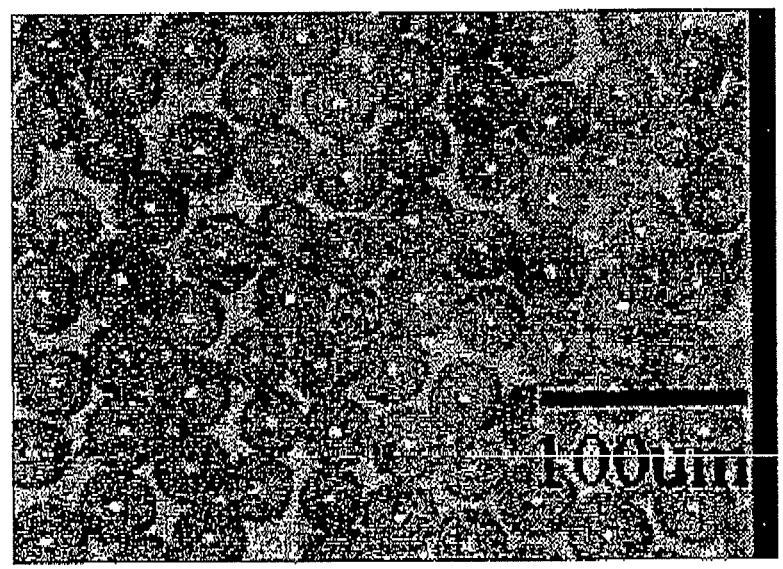
FIG. 8 is a view showing a micrograph of a surface of UTE 12.
Figure 10:
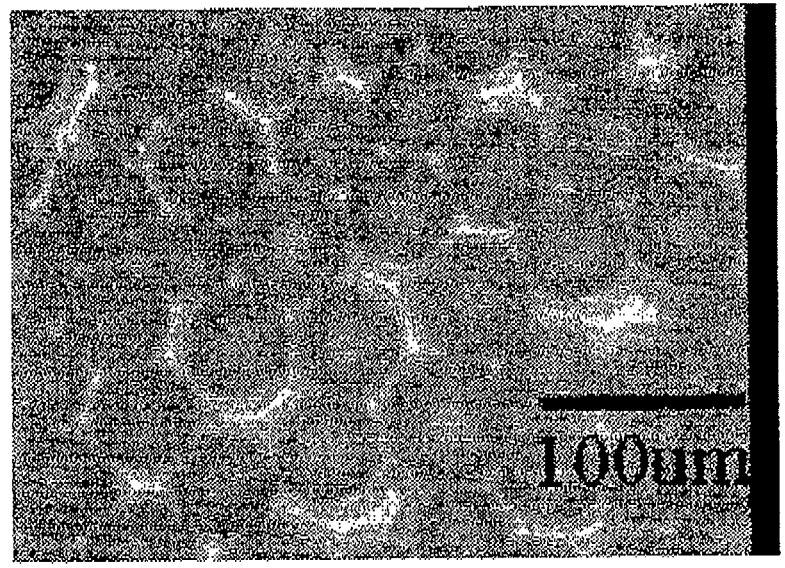
FIG. 10 is a view showing a micrograph of a surface of UTE 21.

The concave-convex structure of the light extracting surface 2 of the light extracting member 1 is preferably formed with a plurality of granular objects dispersed on the surface. The granular objects may be integrally formed with the light extracting surface portion or may be adhered to the surface. The granular objects may be periodically arranged or may be non-periodically arranged. The non-periodically arranged granular objects can suppress light interference due to the granular objects and hence can suppress moire and the like. FIGS. 7, 8, and 10 illustrate examples of the light extracting member having a plurality of granular objects dispersed on the surface.

The convex or the concave having a too large size in a direction parallel to the surface of the light extracting member 1 (i.e., width) tends to lead to non-uniform brightness at the surface of the light extracting member 1, while the convex or the concave having a too small size tends to increase the cost for manufacturing the light extracting member 1. Accordingly, the size is preferably from 0.5 µm to 100 µm, and more preferably from 1 µm to 50 µm. The height of the convex or the concave in the normal direction of the surface of the light extracting member 1 is usually determined depending on the width of the convex or the concave, or the arranging periodicity of the concave-convex structure. Usually, the height is preferably equal to or less than the width of the concave or the convex, or equal to or less than the arranging periodicity of the concave-convex structure, and is from 0.25 µm to 70 µm, and preferably from 0.5 µm to 50 µm.

The shape of the convex or the concave is not particularly limited, but preferably a shape having a curved surface, and for example, preferably a hemisphere shape. The concave or the convex is preferably arranged non-periodically because such an arrangement can suppress moire and the like as described above. When viewed from one side in the normal direction of the surface of the light extracting member 1, the area where the concave and the convex are formed within the light extracting surface 2 of the light extracting member 1 is preferably 60% or more of the surface area of the light extracting member 1, and the upper limit is the value in the case where the surface area is filled with the concave and the convex.

The material constituting the light extracting member 1 may be any transparent material, and inorganic materials such as glass and organic materials (low molecular compounds or macromolecular compounds) may be used. The macromolecular compound used for the light extracting member 1 may include polyarylate, polycarbonate, polycycloolefin, polyethylene naphthalate, polyethylene sulfonate, polyethylene terephthalate, and the like. The thickness of the light extracting member 1 is not particularly limited, but the member having a too small thickness is difficult to be handled, while the member having a too large thickness tends to lower the total light transmittance. Therefore, the thickness is preferably from 50 µm to 2 mm, and more preferably from 80 µm to 1.5 mm.

The light extracting member composed of an inorganic material such as glass can be obtained by etching a flat base composed of the inorganic material. The member can be obtained by, for example, selectively etching a portion where a concave-convex structure is to be formed, in a flat base surface. Specifically, the concave-convex structure can be formed by patterning a protective film on the surface of a base composed of an inorganic material, and subjecting the base to liquid-phase etching, gas-phase etching, or the like. The protective film can be patterned by, for example, using a photoresist.

For the light extracting member composed of an organic material, the concave-convex structure of the surface can be formed by, for example, the methods (1) to (5) described below. (1) A method of pressing a metal plate having a concave-convex surface on a heated film to transfer the concave-convex shape of the metal plate. (2) A method of rolling a polymer sheet or film using a roll having a concave-convex surface. (3) A method of putting drops of a solution or a dispersion liquid containing an organic material on a base having a concave-convex surface to form a film. (4) A method of forming a film composed of a polymerizable monomer, and then selectively photopolymerizing a part of the film and removing the unpolymerized part. (5) A method of casting a polymer solution on a base under a high humidity condition to transfer a water drop structure to the surface.

Figure 4:
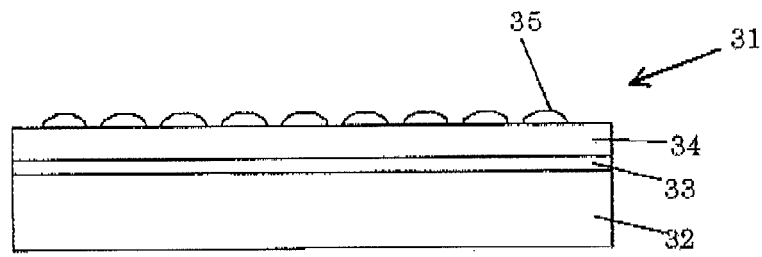
FIG. 4 is a view illustrating a light extracting member 31 having a stacked structure.

The light extracting member may have a single layer structure or a stacked structure. FIG. 4 illustrates a light extracting member 31 having a stacked structure. The light extracting member 31 having a stacked structure is formed by stacking a supporting substrate 32, an adhesion layer 33, and a film 34 having the light extracting surface 35 in this order.

As illustrated in FIG. 4, the film 34 is bonded to the supporting substrate 32 while facing the surface opposite to the light extracting surface 35 having a concave-convex structure to the supporting substrate 32. For the adhesion layer 33, a thermosetting resin, a photocurable resin, an adhesive agent, an adhesive material, or the like may be used. For example, the film 34 is laminated with the supporting substrate 32 through a thermosetting resin, and the thermosetting resin is heated at a predetermined temperature to bond the film 34 to the supporting substrate 32. Alternatively, the film 34 is laminated with the supporting substrate 32 through a photocurable resin, and for example, the photocurable resin is irradiated with ultraviolet rays to bond the film 34 to the supporting substrate 32.

When the film 34 is directly formed on the supporting substrate 32, the adhesion layer is not required, and when the surface of the supporting substrate 32 is processed to form a concave-convex structure, the adhesion layer is also not required.

The light extracting surface of the film 34 has the same shape with the light extracting surface of the light extracting member 1 described above.

The formation of an air layer between the film 34 and the supporting substrate 32 leads to light reflection at an interface of the air layer, and thus the light extraction efficiency is likely to be lowered. Therefore, it is preferable that the film 34 is bonded to the supporting substrate 32 through the adhesion layer 33 so that the air layer will not be formed therebetween.

The absolute value of the difference between the maximum value and the minimum value among the refractive index of the film 34, the refractive index na of the adhesion layer 33, and the refractive index ns of the supporting substrate 32 is preferably less than 0.2. That is, the light extracting member 31 preferably satisfies Equation (3) below.

$$|nf-ns|<0.2$$

$$|nf-na|<0.2$$

$$|ns-na|<0.2 \qquad \text{Equation (3)}$$

By setting the absolute value of the difference between the maximum value and the minimum value among the refractive indexes of the film 34, the adhesion layer 33, and the supporting substrate 32 to less than 0.2, the reflection within the light extracting member 31 can be suppressed to improve the light extraction efficiency.

The film 34 and the supporting substrate 32, which constitutes the light extracting member 31 of a stacked structure, may be composed of any transparent material as with the light extracting member 1 described above, and can be formed using, for example, the materials exemplified for the light extracting member 1.

Each thickness of the film 34 and the supporting substrate 32 is not particularly limited. The thickness of the light extracting member 31 having a stacked structure in which the film 34 is bonded to the supporting substrate 32 while interposing the adhesion layer 33 is preferably from 50 μm to 2 mm, and more preferably from 80 μm to 1.5 mm.

2) Light-Emitting Device

The light-emitting device comprises an organic EL element including an organic electroluminescent element using the light extracting member that is provided on a side for extracting light emitted by the organic electroluminescent element. The organic EL element usually comprises a supporting substrate. As described above, in a bottom emission type organic EL element, the light extracting member having a stacked structure in which the film is bonded to the supporting substrate through the adhesion layer may be used for the organic EL element, or the light extracting member may be used as the supporting substrate.

Figure 5:
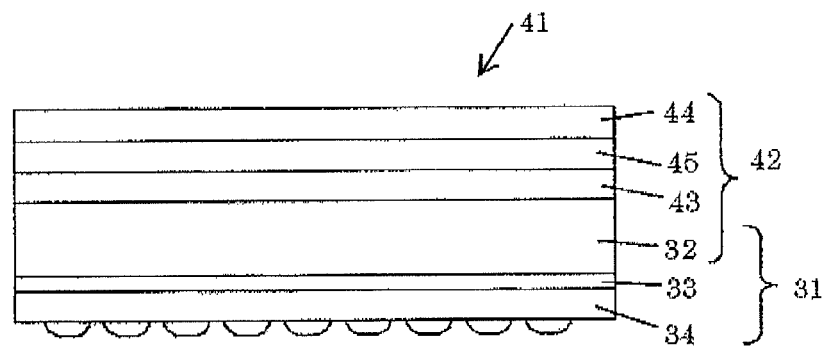
FIG. 5 is a schematic view of a light-emitting device 41.

FIG. 5 is a schematic view of a light-emitting device 41 of the present embodiment. FIG. 5 illustrates, as an example, the light-emitting device 41 comprising an organic EL element 42 using the light extracting member 31 of a stacked structure. The organic EL element 42 is a bottom emission type element that emits light toward the supporting substrate side. The light extracting member 31 is not limited to the stacked structure but may have a single layer structure. For example, a supporting substrate, a surface of which has a concave-convex structure, may be used as the light extracting member.

In the present embodiment, the light extracting member 31 serves as not only a light extracting member but also a supporting substrate on which the organic EL element 42 is installed. FIG. 5 illustrates the light-emitting device 41 in which the electrode of the organic EL element 42 is arranged to be in contact with the supporting substrate 32, but predetermined member may be interposed between the electrode and the supporting substrate 32. The light extracting member 31 is arranged so that the light extracting surface 35 will be placed at the outermost surface of the light-emitting device 41.

The light extracting member 31 has the optical characteristics as described above, and hence the light-emitting device 41 in which the organic EL element 42 is installed on the light extracting member 31 improves the frontal intensity and the integrated intensity of output light. Therefore, the light-emitting device 41 can be used as a light source suitable for, for example, illuminating devices.

The organic EL element comprises a pair of electrodes 43 and 44, and a light-emitting layer 45 placed between the electrodes. One electrode of the pair of electrodes 43 and 44 serves as an anode, and the other electrode serves as a cathode. Between the pair of electrodes 43 and 44, not only one light-emitting layer but also a plurality of light-emitting layers or a certain layer may be provided in consideration of simplicity of process, characteristics, and the like.

In the present embodiment, the bottom emission type organic EL element is provided on the light extracting member 31, and thus one electrode 43 of the pair of electrodes 43 and 44, which is placed near the light extracting member 31, is composed of a light transmissive electrode. That is, light emitted from the light-emitting layer is output to the outside through one light transmissive electrode 43 and the light extracting member 31.

The light extracting member of the present invention can be suitably used for a planar light source. A size of an organic EL element to which the light extracting member is applied is preferably equal to or more than a size where the planar light source can provide its characteristics. For example, the size is preferably 10 mm square or larger in a plane view. The structure of the organic EL element will be described later in detail.

Figure 6:
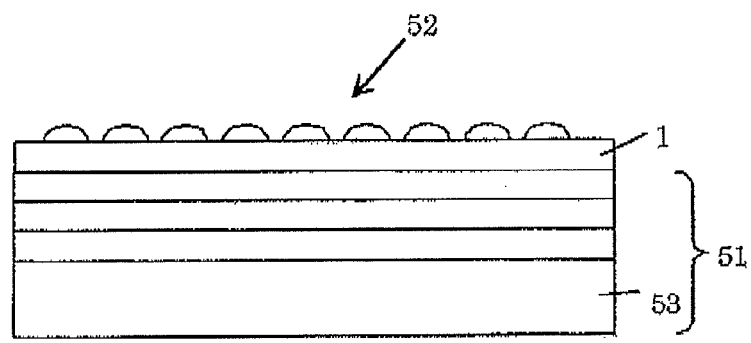
FIG. 6 is a view illustrating a light-emitting device 52 comprising a top emission type organic EL element 51 and the light extracting member 1.

As described above, the light extracting member of the present invention can be used for the so-called top emission type organic EL element that emits light toward the side opposite to the supporting substrate on which the organic EL element is installed. FIG. 6 illustrates a light-emitting device 52 comprising a top emission type organic EL element 51 and the light extracting member 1. The light extracting member 1 is not limited to the single layer structure but may have a stacked structure.

The light-emitting device 52 of the present embodiment comprises a supporting substrate 53 on which an organic EL element 51 is installed.

The organic EL element 51 emits light toward the side opposite to the supporting substrate 53. Therefore, the light extracting member 1 that is provided on a side for extracting light emitted by the organic EL element is provided on the side opposite to the supporting substrate 53 based on the organic EL element 51. That is, the organic EL element 51 is sandwiched between the light extracting member 1 and the supporting substrate 53. Between the light extracting member 1 and the organic EL element 51, a certain member may be interposed.

The organic EL element emits light toward the side opposite to the supporting substrate 53 (toward the light extracting member 1 side). Thus, one electrode of the pair of electrodes, which is placed near the light extracting member 1, is composed of a light transmissive electrode. That is, light emitted from the light-emitting layer is output to the outside through the light transmissive electrode and the light extracting member 1.

Such a light extracting member 1 also serves as, for example, a sealing member.

(Organic EL Element)

Hereinafter, the structure of an organic EL element will be described in further detail.

As described above, between the pair of electrodes, a certain layer may be provided in addition to the light-emitting layer, and the light-emitting layer may be provided in a single layer or in a plurality of layers. The layer provided between the cathode and the light-emitting layer may include an electron injection layer, an electron transport layer, a hole block layer, and the like. When both the electron injection layer and the electron transport layer are provided between the cathode and the light-emitting layer, a layer in contact with the cathode is referred to as the electron injection layer, and a layer except for the electron injection layer is referred to as the electron transport layer.

The electron injection layer has function to improve electron injection efficiency from the cathode. The electron transport layer has function to improve electron injection from a layer in contact with the surface of a cathode side thereof. The hole block layer has function to block the transport of holes. When the electron injection layer and/or the electron transport layer has function to block the transport of holes, such layer may also serve as the hole block layer.

The function of the hole block layer to block the transport of holes can be confirmed by, for example, manufacturing an element in which only hole current flows and confirming an effect of blocking holes based on the reduction of the current value.

The layer provided between the anode and the light-emitting layer may include a hole injection layer, a hole transport layer, an electron block layer, and the like. When both the hole injection layer and the hole transport layer are provided between the anode and the light-emitting layer, a layer in contact with the anode is referred to as the hole injection layer, and a layer except for the hole injection layer is referred to as the hole transport layer.

The hole injection layer has function to improve hole injection efficiency from the anode. The hole transport layer has function to improve hole injection from a layer in contact with the surface of an anode side thereof. The electron block layer has function to block the transport of electrons. When the hole injection layer and/or the hole transport layer has function to block the transport of electrons, such layer may also serve as the electron block layer.

The function of the electron block layer to block the transport of electrons can be confirmed by, for example, manufacturing an element in which only electron current flows and confirming an effect of blocking electrons based on the reduction of the current value.

The electron injection layer and the hole injection layer may be collectively referred to as a charge injection layer, and the electron transport layer and the hole transport layer may be collectively referred to as a charge transport layer.

Layer structures applicable to the organic EL element of the present embodiment are exemplified below.
a) anode/light-emitting layer/cathode
b) anode/hole injection layer/light-emitting layer/cathode
c) anode/hole injection layer/light-emitting layer/electron injection layer/cathode
d) anode/hole injection layer/light-emitting layer/electron transport layer/cathode
e) anode/hole injection layer/light-emitting layer/electron transport layer/electron injection layer/cathode
f) anode/hole transport layer/light-emitting layer/cathode
g) anode/hole transport layer/light-emitting layer/electron injection layer/cathode
h) anode/hole transport layer/light-emitting layer/electron transport layer/cathode
i) anode/hole transport layer/light-emitting layer/electron transport layer/electron injection layer/cathode
j) anode/hole injection layer/hole transport layer/light-emitting layer/cathode
k) anode/hole injection layer/hole transport layer/light-emitting layer/electron injection layer/cathode
l) anode/hole injection layer/hole transport layer/light-emitting layer/electron transport layer/cathode
m) anode/hole injection layer/hole transport layer/light-emitting layer/electron transport layer/electron injection layer/cathode
n) anode/light-emitting layer/electron injection layer/cathode
o) anode/light-emitting layer/electron transport layer/cathode
p) anode/light-emitting layer/electron transport layer/electron injection layer/cathode
(wherein a symbol "/" indicates that the layers across the symbol "/" are adjacently stacked. The same shall apply hereinafter.)

The organic EL element of the present embodiment may include two or more light-emitting layers. When a stacked body interposed between an anode and a cathode in any one of the layer structures of a) to p) described above is indicated by a "structural unit A," the structure of the organic EL element having two light-emitting layers may include a layer structure of the following q). The layer structures of the two (structural unit A) may be the same as or different from each other.
q) anode/(structural unit A)/charge generation layer/(structural unit A)/cathode When "(structural unit A)/charge generation layer" is indicated by a "structural unit B," the structure of the organic EL element having three or more light-emitting layers may include a layer structure of the following r).
r) anode/(structural unit B)x/(structural unit A)/cathode A symbol "x" represents an integer of two or more, and (structural unit B)x represents a stacked body in which the structural unit B is stacked x times. The layer structures of a plurality of "structural unit B" may be the same as or different from each other.

The charge generation layer is a layer that generates holes and electrons when electric field is applied thereto. Examples of the charge generation layer may include a thin film of vanadium oxide, indium tin oxide (Abbrev.: ITO), molybdenum oxide, or the like.

The order or the number of the layers to be stacked and the thickness of each layer can be appropriately designed in consideration of luminous efficiency or the lifetime of an element.

Next, the material and the forming method of each layer constituting the organic EL element are described more specifically.

<Substrate>

A substrate that is not deformed in a process of manufacturing the organic EL element is suitably used. For example, glass, plastic, polymer films, silicon plates, and stacked bodies of them are used. For the substrate, a commercially available substrate may be used. The substrate can also be produced by a known method.

<Anode>

In an organic EL element having a structure in which light emitted from the light-emitting layer is output through the anode to the outside, a light transmissive electrode is used for the anode. For the light transmissive electrode, a thin film of a metal oxide, a metal sulfide, a metal, or the like may be used, and an electrode with high electrical conductivity and high light transmittance is suitably used. Specifically, a thin film of, for example, indium oxide, zinc oxide, tin oxide, ITO, indium zinc oxide (Abbrev.: IZO), gold, platinum, silver, copper, and the like is used. Among them, a thin film of ITO, IZO, or tin oxide is suitably used. The method for manufacturing the anode may include a vacuum deposition method, a sputtering method, an ion plating method, a plating method, and the like. For the anode, a transparent conductive film of an organic substance such as polyaniline or derivatives thereof and polythiophene or derivatives thereof may also be used.

The film thickness of the anode is appropriately designed in consideration of required properties, simplicity of processes, and the like. The film thickness of the anode is, for example, from 10 nm to 10 µm, preferably from 20 nm to 1 µm, and more preferably from 50 nm to 500 nm.

<Hole Injection Layer>

Hole injection materials constituting the hole injection layer may include oxides such as vanadium oxide, molybdenum oxide, ruthenium oxide and aluminum oxide, phenylamine compounds, starburst-type amine compounds, phthalocyanine compounds, amorphous carbon, polyaniline, polythiophene derivatives, and the like.

Examples of a method for forming a film of the hole injection layer may include a film formation from a solution containing the hole injection material. For example, a solution containing the hole injection material is applied to form a film by a predetermined applying method, and then the film is solidified to form the hole injection layer.

A solvent used for the film formation from the solution is not particularly limited as long as the solvent can dissolve the hole injection material. The solvent may include chlorine based solvents such as chloroform, methylene chloride and dichloroethane; ether based solvents such as tetrahydrofuran;

aromatic hydrocarbon based solvents such as toluene and xylene; ketone based solvents such as acetone and methyl ethyl ketone; ester based solvents such as ethyl acetate, butyl acetate and ethyl cellosolve acetate; and water.

The applying method may include a spin coating method, a casting method, a micro-gravure coating method, a gravure coating method, a bar coating method, a roll coating method, a wire bar coating method, a dip coating method, a spray coating method, a screen printing method, a flexo printing method, an offset printing method, an ink-jet printing method, and the like.

The film thickness of the hole injection layer is appropriately designed in consideration of required properties, simplicity of processes, and the like. The film thickness of the hole injection layer is, for example, from 1 nm to 1 μm, preferably from 2 nm to 500 nm, and more preferably from 5 nm to 200 nm.

<Hole Transport Layer>

Hole transport materials constituting the hole transport layer may include polyvinyl carbazole or derivatives thereof, polysilane or derivatives thereof, polysiloxane derivatives having an aromatic amine on the side chain or the main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, poly (p-phenylene vinylene) or derivatives thereof, poly(2,5-thienylene vinylene) or derivatives thereof, and the like.

Among them, the hole transport material is preferably a polymer hole transport material such as polyvinyl carbazole or derivatives thereof, polysilane or derivatives thereof, polysiloxane derivatives having an aromatic amine compound group on the side chain or the main chain, polyaniline or derivatives thereof, polythiophene or derivatives thereof, polyarylamine or derivatives thereof, poly(p-phenylene vinylene) or derivatives thereof, and poly(2,5-thienylene vinylene) or derivatives thereof, and further preferably polyvinyl carbazole or derivatives thereof, polysilane or derivatives thereof, and polysiloxane derivatives having an aromatic amine on the side chain or the main chain. When the hole transport material is a low molecular material, it is preferable that the material is used by being dispersed in a polymer binder.

A method for forming a film of the hole transport layer is not particularly limited. The method using a low molecular hole transport material may include a film formation from a mixed solution containing a polymer binder and the hole transport material, and the method using a polymer hole transport material may include a film formation from a solution containing the hole transport material.

A solvent used for the film formation from the solution is not particularly limited as long as the solvent can dissolve the hole transport material. The solvent may include chlorine based solvents such as chloroform, methylene chloride and dichloroethane; ether based solvents such as tetrahydrofuran; aromatic hydrocarbon based solvents such as toluene and xylene; ketone based solvents such as acetone and methyl ethyl ketone; and ester based solvents such as ethyl acetate, butyl acetate and ethyl cellosolve acetate.

The method for the film formation from the solution may include a applying method similar to the method for the film formation of the hole injection layer described above.

The polymer binder to be mixed is preferably a binder that does not extremely inhibit charge transportation, and a binder having weak absorption of visible light is suitably used. Examples of the polymer binder may include polycarbonate, polyacrylate, polymethyl acrylate, polymethyl methacrylate, polystyrene, polyvinyl chloride, and polysiloxane.

The optimal value of the film thickness of the hole transport layer varies depending on the material used and may be appropriately selected so that the driving voltage and the luminous efficiency will be appropriate values, but a thickness where no pinhole is formed is necessary. However, when the film thickness is too large, the driving voltage of the element becomes high, which is not preferred. Therefore, the film thickness of the hole transport layer is, for example, from 1 nm to 1 μm, preferably from 2 nm to 500 nm, and further preferably from 5 nm to 200 nm.

<Light-Emitting Layer>

The light-emitting layer is generally made of an organic substance that mainly emits any one of fluorescence and/or phosphorescence, or made of the organic substance and a dopant assisting the organic substance. The dopant is added in order to, for example, improve the luminous efficiency or change the emission wavelength. The organic substance contained in the light-emitting layer may be a low molecular compound or a macromolecular compound. The macromolecular compound generally has a higher solubility in solvent than the low molecular compound, and therefore is suitably used in an applying method. For this reason, the light-emitting layer preferably comprises the macromolecular compound, and preferably comprises, as the macromolecular compound, a compound having a polystyrene equivalent number average molecular weight of from $10^3$ to $10^8$. Examples of light-emitting materials constituting the light-emitting layer may include the following pigment-based materials, metal complex-based materials, polymer-based materials, and dopant materials.

(Pigment-Based Materials)

Examples of the pigment-based materials may include cyclopentamine derivatives, tetraphenyl butadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex-Based Materials)

Examples of the metal complex-based materials may include metal complexes having, as a central metal, a rare-earth metal such as Tb, Eu and Dy, Al, Zn, Be, Ir, Pt, or the like and having, as a ligand, a structure of oxadiazole, thiadiazole, phenylpyridine, phenylbenzimidazole, quinoline structure, or the like. Examples of the metal complex-based materials may include metal complexes that emit light from the triplet excited state such as iridium complexes and platinum complexes; aluminumquinolinol complexes; benzoquinolinol beryllium complexes; benzoxazolyl zinc complexes; benzothiazole zinc complexes; azomethyl zinc complexes; porphyrin zinc complexes; and phenanthroline europium complexes.

(Polymer-Based Materials)

The polymer-based materials may include polyparaphenylene vinylene derivatives, polythiophene derivatives, polyparaphenylene derivatives, polysilane derivatives, polyacetylene derivatives, polyfluorene derivatives, polyvinylcarbazole derivatives, and materials obtained by polymerizing the pigment-based materials or the metal complex-based light-emitting materials described above.

Among the light-emitting materials described above, the material emitting blue light may include distyrylarylene derivatives, oxadiazole derivatives, and polymers thereof, polyvinyl carbazole derivatives, polyparaphenylene derivatives, polyfluorene derivatives, and the like. Among them, polymer materials such as polyvinyl carbazole derivatives, polyparaphenylene derivatives and polyfluorene derivatives are preferred.

The material emitting green light may include quinacridone derivatives, coumarin derivatives, and polymers thereof, polyparaphenylene vinylene derivatives, polyfluorene derivatives, and the like. Among them, polymer materials such as polyparaphenylene vinylene derivatives and polyfluorene derivatives are preferred.

The material emitting red light may include coumarin derivatives, thiophene ring compounds, and polymers thereof, polyparaphenylene vinylene derivatives, polythiophene derivatives, polyfluorene derivatives, and the like. Among them, polymer materials such as polyparaphenylene vinylene derivatives, polythiophene derivatives and polyfluorene derivatives are preferred.

The material emitting white light may include mixtures of the materials emitting each color light of blue, green or red described above; and polymers obtained by polymerizing, as monomers, substances constituting the materials emitting each color light. Alternatively, by stacking light-emitting layers each formed with using the material emitting each color, an element that generally emits white light may also be realized.

(Dopant Materials)

Examples of the dopant materials may include perylene derivatives, coumarin derivatives, rubrene derivatives, quinacridone derivatives, squarylium derivatives, porphyrin derivatives, styryl pigments, tetracene derivatives, pyrazolone derivatives, decacyclene, and phenoxazone. The thickness of the light-emitting layer is usually about 2 nm to 200 nm.

<Method for Forming a Film of the Light-Emitting Layer>

A method for forming a film of the light-emitting layer may include a method of applying a solution containing the light-emitting material, a vacuum deposition method, a transfer method, and the like. The solvent used for the film formation from a solution may include solvents similar to the solvents used for the film formation of the hole injection layer from the solution.

The method of applying a solution containing a light-emitting material may include coating methods such as a spin coating method, a casting method, a micro-gravure coating method, a gravure coating method, a bar coating method, a roll coating method, a wire bar coating method, a dip coating method, a slit coating method, a capillary coating method, a spray coating method and a nozzle coating method; and applying methods such as a gravure printing method, a screen printing method, a flexo printing method, an offset printing method, a reverse printing method and an ink-jet printing method. From the view point of easiness in pattern formation and separate application of individual colors, printing methods such as a gravure printing method, a screen printing method, a flexo printing method, an offset printing method, a reverse printing method and an ink-jet printing method are preferred. For a sublimation low molecular compound, a vacuum deposition method may be used. Moreover, laser transfer or thermal transfer may be used to form the light-emitting layer only at a desired area.

<Electron Transport Layer>

For electron transport materials constituting the electron transport layer, known materials may be used. The electron transport materials may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or of derivatives of 8-hydroxyquinoline, polyquinoline or derivatives thereof, polyquinoxaline or derivatives thereof, polyfluorene or derivatives thereof, and the like.

Among them, the electron transport material is preferably oxadiazole derivatives, benzoquinone or derivatives thereof, anthraquinone or derivatives thereof, metal complexes of 8-hydroxyquinoline or of derivatives of 8-hydroxyquinoline, polyquinoline or derivatives thereof, polyquinoxaline or derivatives thereof, and polyfluorene or derivatives thereof, and further preferably 2-(4-biphenylyl)-5-(4-t-butylphenyl)-1,3,4-oxadiazole, benzoquinone, anthraquinone, tris(8-quinolinol)aluminum, and polyquinoline.

A method for forming a film of the electron transport layer is not particularly limited. The method using a low molecular electron transport material may include a vacuum deposition method from a powder, and a film formation from a solution or a melted state, and the method using a polymer electron transport material may include a film formation from a solution or a melted state. For the film formation from a solution or a melted state, a polymer binder may be used in combination. The method for forming a film of the electron transport layer from a solution may include film formation methods similar to the methods for forming a film of the hole injection layer from a solution described above.

The optimal value of the film thickness of the electron transport layer varies depending on the material used and may be appropriately selected so that the driving voltage and the luminous efficiency will be appropriate values, but a thickness where no pinhole is formed is necessary. When the film thickness is too large, the driving voltage of the element becomes high, which is not preferred. Therefore, the film thickness of the electron transport layer is, for example, from 1 nm to 1 µm, preferably from 2 nm to 500 nm, and further preferably from 5 nm to 200 nm.

<Electron Injection Layer>

For materials constituting the electron injection layer, optimal material is appropriately selected depending on the type of the light-emitting layer. The materials may include: alkali metals; alkaline-earth metals; alloys containing one or more of alkali metals and alkaline-earth metals; oxides, halides and carbonates of alkali metals or alkaline-earth metals; and a mixture of these substances. Examples of the alkali metals, and the oxides, halides and carbonates of alkali metals may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline-earth metals, and the oxides, halides and carbonates of alkaline-earth metals may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be a stacked body in which two or more layers are stacked, and an example thereof may include LiF/Ca. The electron injection layer is formed by, for example, a vapor deposition method, a sputtering method, a printing method, or the like. The film thickness of the electron injection layer is preferably about 1 nm to 1 µm.

<Cathode>

A material that has a low work function, facilitates electron injection into the light-emitting layer, and has high electrical conductivity is preferred as a material of the cathode. In the organic EL element in which light is extracted from the anode side, a material having high visible light reflectance is preferred as the material of the cathode because the cathode reflects the light output from the light-emitting layer to the anode. For example, alkali metals, alkaline-earth metals, transition metals, and the metals of Group 13 of the Periodic Table may be used for the cathode. Examples of the materials of the cathode may include: metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium; alloys of two or more of the metals; alloys of one or more of the metals and one or more of gold, silver, platinum, copper, manganese, titanium, cobalt, nickel, tungsten and tin; and graphite or graphite intercalation compounds. Examples of the alloys may include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. For the cathode, a transparent conductive electrode made of a conductive metal oxide, a conductive organic substance, or the like may be used. Specific examples of the conductive metal oxide may include indium oxide, zinc oxide, tin oxide, ITO, and IZO. Specific examples of the conductive organic substance may include polyaniline or derivatives thereof and polythiophene or derivatives thereof. The cathode may be a stacked body in which two or more layers are stacked. The electron injection layer may be used as the cathode.

The film thickness of the cathode is appropriately designed in consideration of required properties, simplicity of processes, and the like. The film thickness of the cathode is, for example, from 10 nm to 10 μm, preferably from 20 nm to 1 μm, and further preferably from 50 nm to 500 nm.

The method for manufacturing the cathode may include a vacuum deposition method, a sputtering method, a lamination method in which a metal thin film is thermocompression bonded, and the like.

<Insulating Layer>

A material of the insulating layer may include metal fluorides, metal oxides, organic insulating materials, and the like. Examples of the organic EL element provided with the insulating layer having a film thickness of 2 nm or less may include an element provided with the insulating layer having a film thickness of 2 nm or less in contact with the cathode, and an element provided with the insulating layer having a film thickness of 2 nm or less in contact with the anode.

In the light-emitting device comprising the organic EL element using the light extracting member described above, the light extracting member is placed on the surface of the organic EL element in a direction of light extraction. The surface, which is opposite to the organic EL element, of the light extracting member has the concave-convex structure, and thus at least a part of the surface of the light-emitting device has the concave-convex shape. A part of the light emitted from the organic EL element enters the light extracting member and is reflected and diffused at the surface having the concave-convex shape, and then is output to the outside of the light-emitting device. The light extracting member provided on the light-emitting device has a concave-convex structure which is configured such that the frontal intensity and the integrated intensity are each greater by a factor of 1.3 in comparison with those of the virtual member having a flat surface. Therefore, not only the frontal brightness but also the overall brightness is improved.

The organic EL element can be formed in a planar shape, and thus a light-emitting device comprising such a light extracting member can be suitably used for an illuminating device, as described above.

EXAMPLES

Examples of the present invention will be described hereinafter, but the present invention is not limited to them.

In each of Examples and Comparative Examples, a current of 0.15 mA is applied to an organic EL element, and the light-emitting intensity in a normal direction (frontal direction) and the integrated intensity using an integrating sphere were measured. A light-emitting device in which an organic EL element was provided on a glass substrate having a flat surface was regarded as a standard light-emitting device. The characteristics of the standard light-emitting device were compared with those of each light-emitting device of Examples and Comparative Examples. Specifically, the light-emitting intensity in a frontal direction and the integrated intensity of each light-emitting device of Examples and Comparative Examples were divided by the light-emitting intensity in a frontal direction and the integrated intensity of the standard light-emitting device, respectively. In the standard light-emitting device, the glass substrate having a flat surface corresponds to the virtual member having the flat light extracting surface.

Example 1

A substrate formed with an anode composed of an ITO thin film having a predetermined pattern shape was prepared, and the substrate was cleaned with UV/$O_3$ for 20 minutes. Next, a suspension of poly(3,4-ethylenedioxythiophene)/poly(styrenesulfonate) (manufactured by Starck Vitec Co., trade name: Baytron P CH 8000) was filtered twice. A filter having a pore size of 0.45 μm was used for the first filtration, and a filter having a pore size of 0.2 μm was used for the second filtration. The filtered solution was applied onto the anode by a spin coating method, and the applied coating was heated on a hot plate at 200° C. in the atmosphere for 15 minutes, thus forming a hole injection layer having a thickness of 65 nm.

Then, a xylene solution containing Lumation WP 1330 (manufactured by SUMATION) at a concentration of 1.2% by mass was prepared. The solution was applied onto the hole injection layer by a spin coating method, and the applied coating was heated on a hot plate at 130° C. in a nitrogen atmosphere for 60 minutes, thus forming a light-emitting layer having a thickness of 65 nm.

Next, the substrate formed with the light-emitting layer was placed in a vacuum deposition apparatus, and Ba and Al were sequentially deposited so as to have thickness of 5 nm and 80 nm, respectively, to form a cathode. The metal deposition was started after the vacuum reached $1 \times 10^{-4}$ Pa or less.

Next, to a periphery of a sealing glass, a photocurable sealant was applied with a dispenser, and the substrate formed with the organic EL element was bonded to the sealing glass in a nitrogen atmosphere. Then, ultraviolet rays were applied to cure the photocurable sealant for the sealing.

Next, to the glass substrate, a film UTE 12 (a refractive index of 1.5, a thickness of 188 μm), manufactured by MN teck, having a concave-convex structure formed with a plurality of granular objects dispersed on the surface was bonded using a non-carrier type adhesive (a refractive index of 1.5). The film was bonded so that the concave-convex structure would be placed on the outermost surface. In Example 1, the glass substrate corresponds to the supporting substrate, the film UTE 12 manufactured by MN teck corresponds to the film, the non-carrier type adhesive corresponds to the adhesion layer, and the stacked body in which the glass substrate, the non-carrier type adhesive, and the film UTE 12 manufactured by MN teck were stacked in this order corresponds to the light extracting member.

FIG. 7 shows a micrograph of the cross section of UTE 12, and FIG. 8 shows a micrograph of the surface. As shown in FIG. 7 and FIG. 8, UTE 12 has a plurality of granular concave-convex structure.

UTE 12 had a total light transmittance of 68.4%, a haze of 82.6%, and diffusion parameters I (35)/I (70) of 7.2 and I (0)/I (35) of 1.7. The light-emitting device of the present Example had a frontal brightness of 1.43 times greater and an integrated intensity of 1.34 times greater than those of the standard light-emitting device having the glass substrate without UTE 12.

<Method for Measuring I (θ°)>

Figure 9:
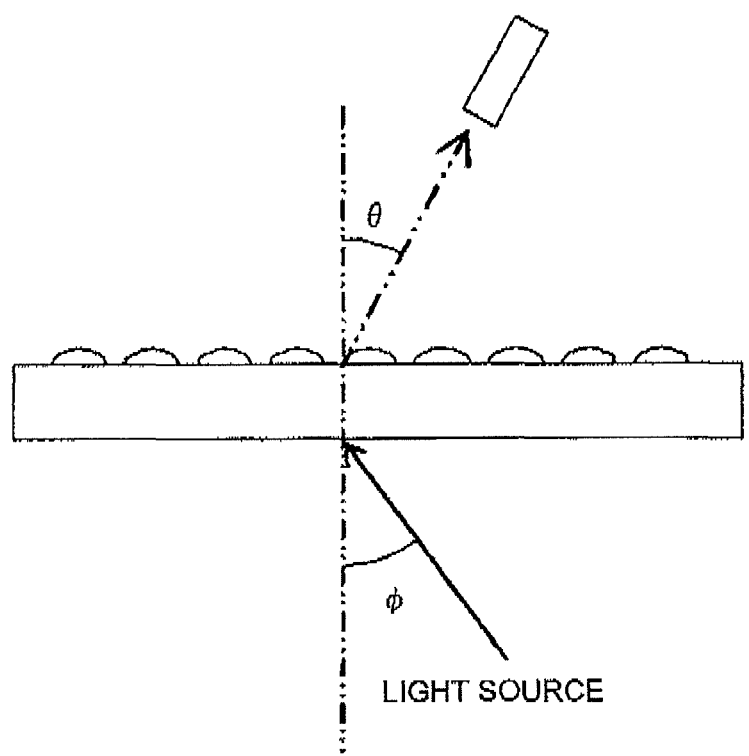
FIG. 9 is a view for explaining a method for measuring I (θ°).

The definition of I (θ°) is as described above. The actual method for measuring I (θ°) in Examples will be described with reference to FIG. 9. As illustrated in FIG. 9, light having an incidence angle of φ° entered the light extracting member, and the light intensity of the light that was output from the light extracting surface and had an angle θ° with the normal line was measured every 5° in a range of ±80°. The light source used was a halogen lamp SPH-100N manufactured by CHUO PRECISION INDUSTRIAL CO., LTD. When a planar light source is used as the light source, light having a specific incidence angle does not enter the light extracting member but light having an angle −90°<φ°<90° simultaneously enters. In order to simulate this, the incidence angle φ° of the incident light was changed by 5° in a range of −80°≤φ°≤80°, and the intensity of the output light in a direction of 0° measured for each incidence angle were integrated, thus determining I (θ°).

Example 2

In the same manner as in Example 1, an organic EL element was formed on a glass substrate. Then, to the glass substrate, a film UTE 21 (a refractive index of 1.5, a thickness of 188 μm), manufactured by MN teck, having a concave-convex structure formed with a plurality of granular objects dispersed on the surface was bonded using a non-carrier type adhesive (a refractive index of 1.5). The film was bonded so that the concave-convex structure of the film would be placed on the outermost surface.

FIG. 10 shows a micrograph of the surface of UTE 21. As shown in FIG. 10, UTE 21 had a plurality of granular concave-convex structure.

UTE 21 had a total light transmittance of 63.4%, a haze of 78.7%, and diffusion parameters I (35)/I (70) of 8.4 and I (0)/I (35) of 2.0. The light-emitting device of the present Example had a frontal brightness of 1.45 times greater and an integrated intensity of 1.34 times greater than those of the standard light-emitting device having the glass substrate without UTE 21.

Example 3

In the same manner as in Example 1, an organic EL element was formed on a glass substrate. Then, to the substrate, a film WF 80 (a refractive index of 1.5, a thickness of 80 μm), manufactured by Wave Front, having a concave-convex structure formed with a plurality of granular objects dispersed on the surface was bonded using a non-carrier type adhesive (a refractive index of 1.5). The film was bonded so that the concave-convex structure of the film would be placed on the outermost surface.

Figure 11:
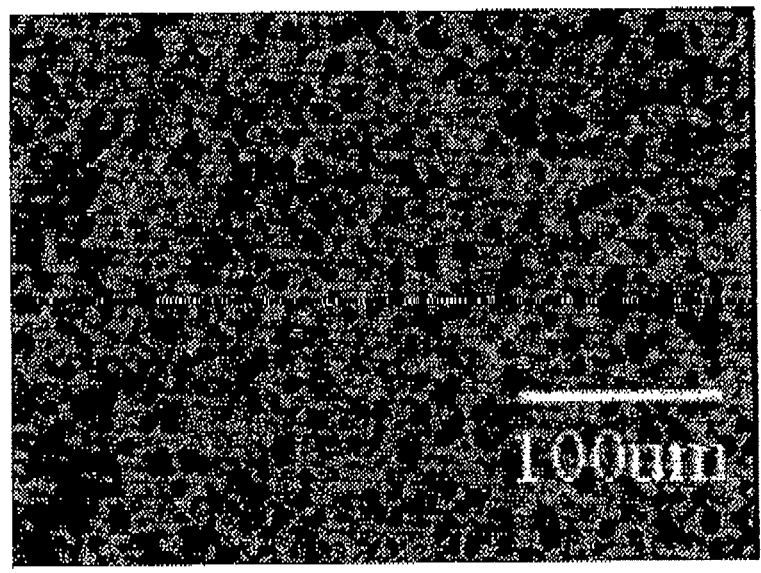
FIG. 11 is a view showing a micrograph of a surface of WF 80.

FIG. 11 shows a micrograph of the surface of WF 80. As shown in FIG. 11, WF 80 had a plurality of granular concave-convex structure.

WF 80 had a total light transmittance of 75.1%, a haze of 89.3%, and diffusion parameters I (35)/I (70) of 6.5 and I (0)/I (35) of 1.1. The light-emitting device of the present Example had a frontal brightness of 1.42 times greater and an integrated intensity of 1.31 times greater than those of the standard light-emitting device having the glass substrate without WF 80.

Comparative Example 1

In the same manner as in Example 1, an organic EL element was formed on a glass substrate. Then, to the glass substrate, a film BEF 100 (a refractive index of 1.5, a thickness of 150 μm) as a prism film manufactured by 3M was bonded using a non-carrier type adhesive (a refractive index of 1.5). The film was bonded so that the concave-convex structure of the film would be placed on the outermost surface.

The light-emitting device of the present Comparative Example had a frontal brightness of 1.26 times greater and an integrated intensity of 1.25 times greater than those of the standard light-emitting device having the glass substrate without BEF 100.

Comparative Example 2

In the same manner as in Example 1, an organic EL element was formed on a glass substrate. Then, to the glass substrate, a film OPALUS PCM 1 (a refractive index of 1.5, a thickness of 120 μm), manufactured by KEIWA SHOKO, having a concave-convex structure formed with a plurality of granular objects dispersed on the surface was bonded using a non-carrier type adhesive (a refractive index of 1.5). The film was bonded so that the concave-convex structure of the film would be placed on the outermost surface.

PCM 1 had a total light transmittance of 92.7%, a haze of 86.0%, and diffusion parameters I (35)/I (70) of 2.0 and I (0)/I (35) of 1.3. The light-emitting device of the present Comparative Example had a frontal brightness of 1.24 times greater and an integrated intensity of 1.26 times greater than those of the standard light-emitting device having the glass substrate without PCM1.

In summary, each device of Examples 1, 2, and 3 had a higher light extraction efficiency than that of each device of Comparative Examples 1 and 2, and had a frontal brightness and an integrated intensity both greater than those of the standard light-emitting device by a factor of 1.3 or more.

TABLE 1

| | Optical Characteristics | | | | Light extraction efficiency | | Surface condition | |
|---|---|---|---|---|---|---|---|---|
| | Total light transmittance | Haze | Diffusion parameter | | | | Cross sectional | Surface |
| | [%] | [%] | I(35)/I(70) | I(0)/I(35) | Frontal | Integral | micrograph | micrograph |
| Example 1 | 68.4 | 82.6 | 7.2 | 1.7 | 1.43 | 1.34 | FIG. 7 | FIG. 8 |
| Example 2 | 63.4 | 78.7 | 8.4 | 2.0 | 1.45 | 1.34 | — | FIG. 10 |
| Example 3 | 75.1 | 89.3 | 6.5 | 1.1 | 1.42 | 1.31 | — | FIG. 11 |
| Comparative Example 1 | 11.5 | 84.3 | — | — | 1.26 | 1.25 | — | — |
| Comparative Example 2 | 92.7 | 86.0 | 2.0 | 1.3 | 1.24 | 1.26 | — | — |

INDUSTRIAL APPLICABILITY

The present invention can provide a light extracting member achieving an organic EL element that can be used for a device requiring other characteristics in addition to the brightness in a normal direction, and a light-emitting device and an illuminating device using the light extracting member.

The invention claimed is:

1. A light extracting member for an organic electroluminescent element, to be provided on a side for extracting light emitted by the organic electroluminescent element, wherein
   a light extracting surface of the member has a concave-convex structure,
   the concave-convex structure is configured such that a frontal intensity and an integrated intensity of light output from the light extracting surface of the member, when light emitted by the organic electroluminescent element enters a light entering surface of the member, are each greater by a factor of 1.3 or more than a frontal intensity and an integrated intensity of light output from a light extracting surface of a virtual member having a flat light extracting surface, when light emitted by the organic electroluminescent element enters a light entering surface of the virtual member, and
   the light extracting member satisfies the following conditions of (A), (B), and (C), when applying light to the member from a planar light source arranged in parallel with the light entering surface of the member:
   (A) Equation (1):

$I(35°)/I(70°) > 5$ is satisfied wherein an intensity of light output from the light extracting surface in a direction having an angle θ° with a normal direction of the light extracting surface of the member is I (θ°);
   (B) the member having a haze value of 60% or more; and
   (C) the member having a total light transmittance of 60% or more.

2. The light extracting member according to claim 1, wherein the light extracting member further satisfies the following Equation (2):

$I(0)/I(35) > 1.5$.

3. The light extracting member according to claim 1, wherein the concave-convex structure is formed with a plurality of granular objects dispersed on the surface.

4. The light extracting member according to claim 1, wherein the light extracting member comprises a supporting substrate, an adhesion layer, and a film having the light extracting surface stacked in this order, and
   an absolute value of a difference between a maximum value and a minimum value among a refractive index of the film, a refractive index ns of the supporting substrate, and a refractive index na of the adhesion layer is less than 0.2.

5. A light-emitting device comprising an organic electroluminescent element using the light extracting member of claim 1.

6. An illuminating device comprising the light-emitting device of claim 5.

* * * * *